(12) United States Patent
Sunaga et al.

(10) Patent No.: US 9,198,277 B2
(45) Date of Patent: Nov. 24, 2015

(54) SIGNAL TRANSMISSION DEVICE

(71) Applicant: Hitachi Metals, Ltd., Minato-ku, Tokyo (JP)

(72) Inventors: Yoshinori Sunaga, Hitachinaka (JP);
Yoshiaki Ishigami, Hitachi (JP);
Hidetaka Kawauchi, Hitachi (JP);
Hidenori Yonezawa, Hitachi (JP);
Kinya Yamazaki, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 279 days.

(21) Appl. No.: 13/872,515

(22) Filed: Apr. 29, 2013

(65) Prior Publication Data
US 2014/0133101 A1    May 15, 2014

(30) Foreign Application Priority Data
Nov. 9, 2012    (JP) .................................. 2012-247806

(51) Int. Cl.
*H05K 7/20*    (2006.01)
*H05K 1/02*    (2006.01)
(Continued)

(52) U.S. Cl.
CPC ............... *H05K 1/0209* (2013.01); *G06F 1/20* (2013.01); *H04B 1/036* (2013.01); *H05K 1/141* (2013.01); *H05K 2201/066* (2013.01); *H05K 2201/10121* (2013.01); *H05K 2201/10189* (2013.01); *H05K 2201/10553* (2013.01)

(58) Field of Classification Search
CPC ...... G06F 1/20; H05K 1/0209; H05K 1/0204; H05K 1/141; H05K 2201/10189; H05K 2201/066; H05K 2201/10121; H05K 2201/10553; H04B 1/036

USPC ........................ 361/688–723; 165/80.1–80.5, 165/104.11–104.34, 185
See application file for complete search history.

(56) References Cited

U.S. PATENT DOCUMENTS 5,533,256 A * 7/1996 Call et al. ......................... 29/840
2005/0243509 A1    11/2005 Fuseya et al.
(Continued)

FOREIGN PATENT DOCUMENTS

JP    53-27766 U    3/1978
JP    56-116699 A    9/1981
(Continued)

OTHER PUBLICATIONS

Japanese Office Action dated Dec. 24, 2014, with English translation (Seven (7) pages).
Japanese Office Action dated Aug. 18, 2015 (three pages).

*Primary Examiner* — Anthony Haughton
*Assistant Examiner* — Yahya Ahmad
(74) *Attorney, Agent, or Firm* — Crowell & Moring LLP (57) ABSTRACT

A height of a signal transmission device is decreased as low as possible as maintaining or improving a cooling performance for the communication module. In a signal transmission device provided with a communication module provided on a substrate and a cooling mechanism for cooling the communication module, the cooling mechanism includes: a heat-transfer plate including a first region which overlaps with bottom surfaces of a plurality of the communication modules and is thermally connected to the bottom surfaces and a second region which does not overlap with the bottom surfaces of the communication modules; and a heat-release fin provided in the second region of the heat-transfer plate.

2 Claims, 7 Drawing Sheets

(51) Int. Cl.
*G06F 1/20* (2006.01)
*H04B 1/036* (2006.01)
*H05K 1/14* (2006.01)

(56) References Cited

U.S. PATENT DOCUMENTS

2007/0223208 A1* 9/2007 Tanaka et al. ............... 361/807
2013/0077254 A1* 3/2013 Nguyen ....................... 361/715

FOREIGN PATENT DOCUMENTS

| JP | S56-116699 | * | 12/1981 | ............ H05K 7/20 |
|---|---|---|---|---|
| JP | 60-22841 | U | 2/1985 | |
| JP | 6-55297 | U | 7/1994 | |
| JP | 7-230022 | A | 8/1995 | |
| JP | 2005-316861 | A | 11/2005 | |
| JP | 2007-266130 | A | 10/2007 | |
| JP | 2010-175995 | A | 8/2010 | |

* cited by examiner

SIGNAL TRANSMISSION DEVICE

CROSS-REFERENCE TO RELATED APPLICATION

The present application claims priority from Japanese Patent Application No. 2012-247806 filed on Nov. 9, 2012, the content of which is hereby incorporated by reference into this application.

TECHNICAL FIELD OF THE INVENTION

The present invention relates to a signal transmission device used for signal transmission between substrates inside an electronic device and signal transmission between electronic devices.

BACKGROUND OF THE INVENTION

A processing performance of a semiconductor chip (IC chip) used for an electronic device such as a high-performance server and a high-speed network device has been improved year by year. Also, along with the improvement of the processing performance of the IC chip, a signal transmission speed between the IC chips and between the IC chip and a communication module has risen steadily. For example, while a mainstream signal transmission speed is about 10 [Gbit/s] so far, it is expected that the signal transmission speed will rise up to about 25 [Gbit/s] in near future.

Under the above-described circumstances, low power consumption of the signal transmission device, downsizing thereof, improvement of a cooling performance thereof, and others are desired. For example, if the signal transmission speed is risen to about 25 [Gbit/s], a compensation circuit for signal waveform shaping is essential even if a signal transmission distance is about 10 cm, and therefore, the power consumption of the signal transmission device is increased, and besides, it is also required to secure a space used for mounting the compensation circuit. Further, a calorific value of the communication module is also increased, and therefore, a size of a cooling mechanism for the communication module is necessarily increased.

As described above, while various demands for the signal transmission device have occurred along with the improvement of the processing performance of the IC chip, the cooling mechanism for the communication module is focused here. A heat sink is cited as one example of the cooling mechanism for the communication module, and conventional signal transmission devices can be roughly categorized as follows based on a mode of the heat sink. That is, the conventional signal transmission devices can be roughly categorized into a type in which the heat sink is individually provided for each of a plurality of communication modules (see Japanese Patent Application Laid-Open Publication No. 2010-175995 (Patent Document 1))) and a type in which a common heat sink is provided for the plurality of communication modules. Accordingly, in the following explanation, the former and the latter are distinguished from each other as an "individual type" and a "collective type" in some cases, respectively.

Indeed, in both types of the signal transmission device, the heat sink is arranged on the communication module. More specifically, in the individual-type signal transmission device, a heat-transfer plate of the heat sink is placed on a top surface of each of the communication modules, and a plurality of heat-release fins stand on each heat-transfer plate. On the other hand, in the collective-type signal transmission device, the heat-transfer plate of the heat sink is placed on top surfaces of the plurality of communication modules so as to collectively cover these modules, and the plurality of heat-release fins stand on a common heat-transfer plate. That is, the individual type and the collective type are common in that the heat-release fins of the heat sink are arranged in an upper portion of the communication module.

SUMMARY OF THE INVENTION

In the conventional signal transmission device, the heat-release fins of the heat sink are arranged in the upper portion of the communication module, and therefore, a height of the signal transmission device is adversely increased. More particularly, as increasing the size of the heat sink along with the increase in the calorific value of the communication module, the height of the signal transmission device is further increased.

A preferred aim of the present invention is to decrease the height of the signal transmission device as low as possible as maintaining or improving the cooling performance for the communication module.

A signal transmission device of the present invention is a signal transmission device provided with: a communication module provided on a substrate; and a cooling mechanism for cooling the communication module, and the cooling mechanism includes: a heat-transfer plate including a first region which overlaps with main surfaces of a plurality of the communication modules and is thermally connected to the main surfaces and a second region which does not overlap with the main surfaces of these communication modules; and heat-release means provided in the second region of the heat-transfer plate.

In an aspect of the present invention, the first region of the heat-transfer plate is arranged between a bottom surface of the communication module and a mounting surface of the substrate facing the bottom surface and is thermally connected to the bottom surface of the communication module.

In another aspect of the present invention, the communication module is supported to be cantilevered from the substrate so that a space is formed between the bottom surface of the communication module and the mounting surface of the substrate, and the first region of the heat-transfer plate is arranged in this space.

In still another aspect of the present invention, the communication module is supported to be cantilevered from the substrate by connecting a first connector provided along one side of the communication module to a second connector provided in the mounting surface of the substrate.

In still another aspect of the present invention, the first region of the heat-transfer plate is overlapped with a top surface of the communication module and is thermally connected to the top surface, and the second region of the heat-transfer plate is provided at a position lower than the first region.

In still another aspect of the present invention, the heat-release means are configured by a plurality of heat-release fins.

In still another aspect of the present invention, two or more heat-release fin groups each of which includes a plurality of the heat-release fins are arranged adjacent to each other so that a space is sandwiched therebetween, and the communication module is arranged so as to be bridged between the two or more heat-release fin groups in plan view.

In still another aspect of the present invention, a communication cable extending from the communication module is pulled outside through the space.

In still another aspect of the present invention, the heat-transfer means are configured by a refrigerant passage and refrigerant circulated through the refrigerant passage.

The height of the signal transmission device can be decreased as low as possible as maintaining or improving the cooling performance for the communication module.

DESCRIPTIONS OF THE PREFERRED EMBODIMENTS

First Embodiment

Figure 1:
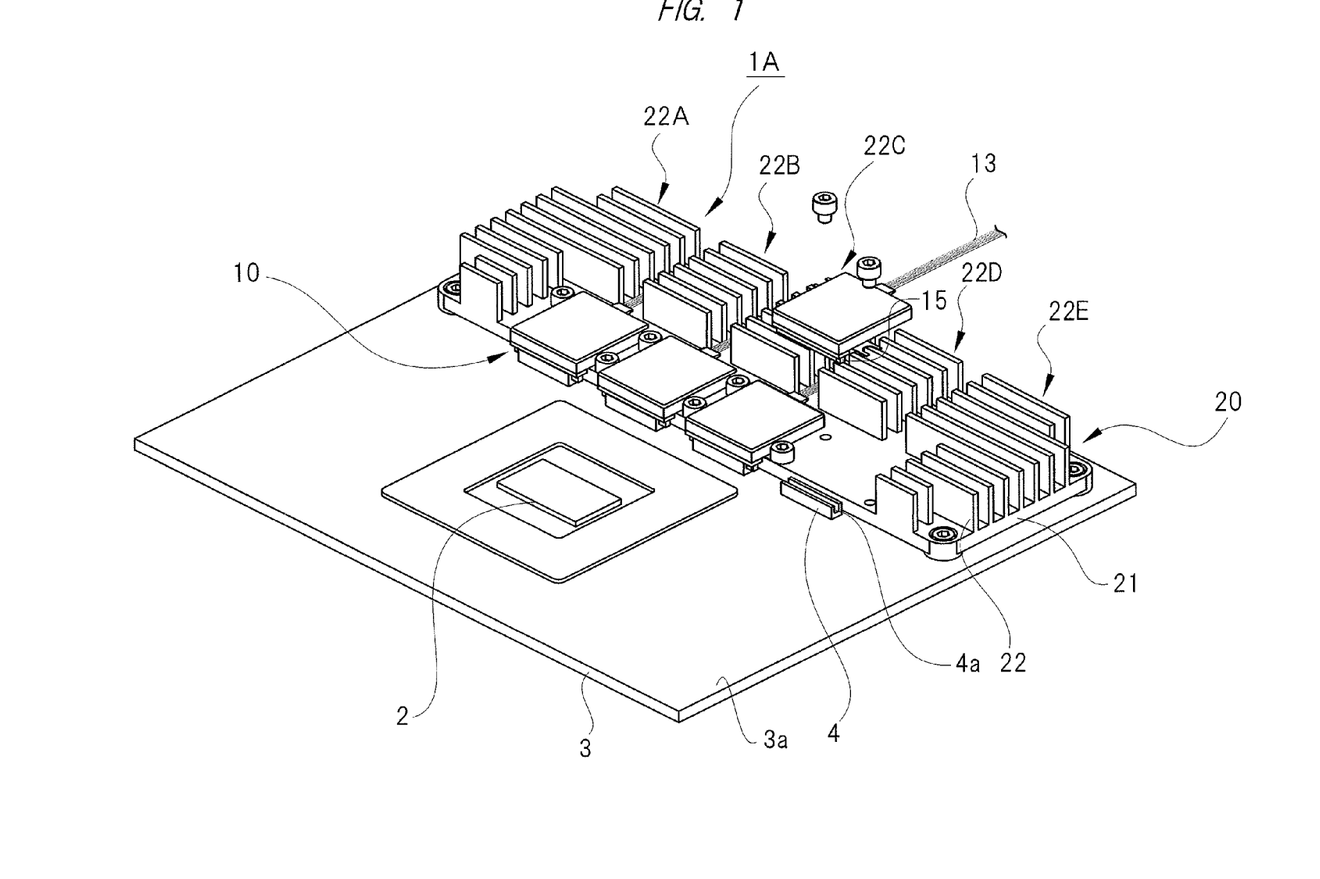
FIG. 1 is a front perspective view illustrating a signal transmission device according to a first embodiment.
Figure 2:
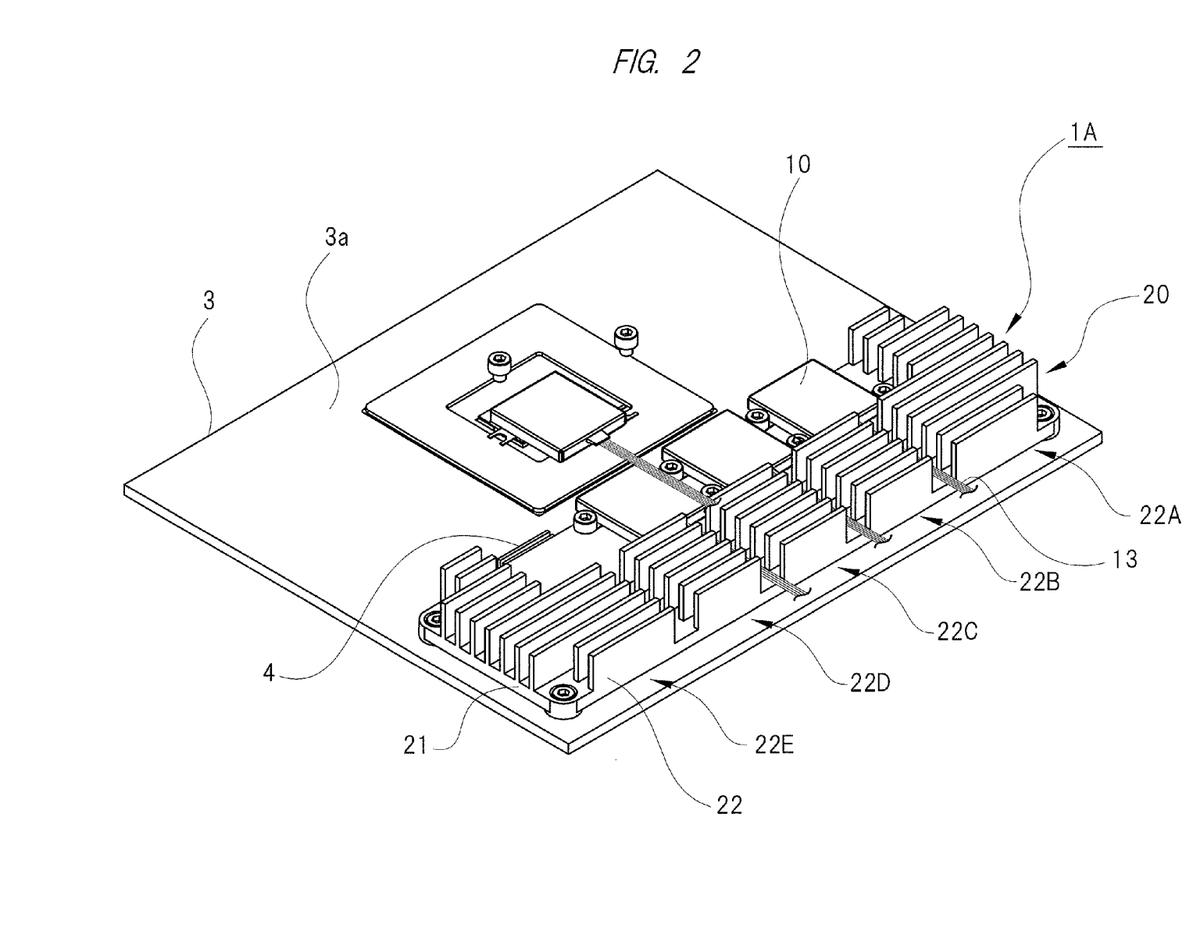
FIG. 2 is a rear perspective view illustrating the signal transmission device according to the first embodiment.
Figure 3:
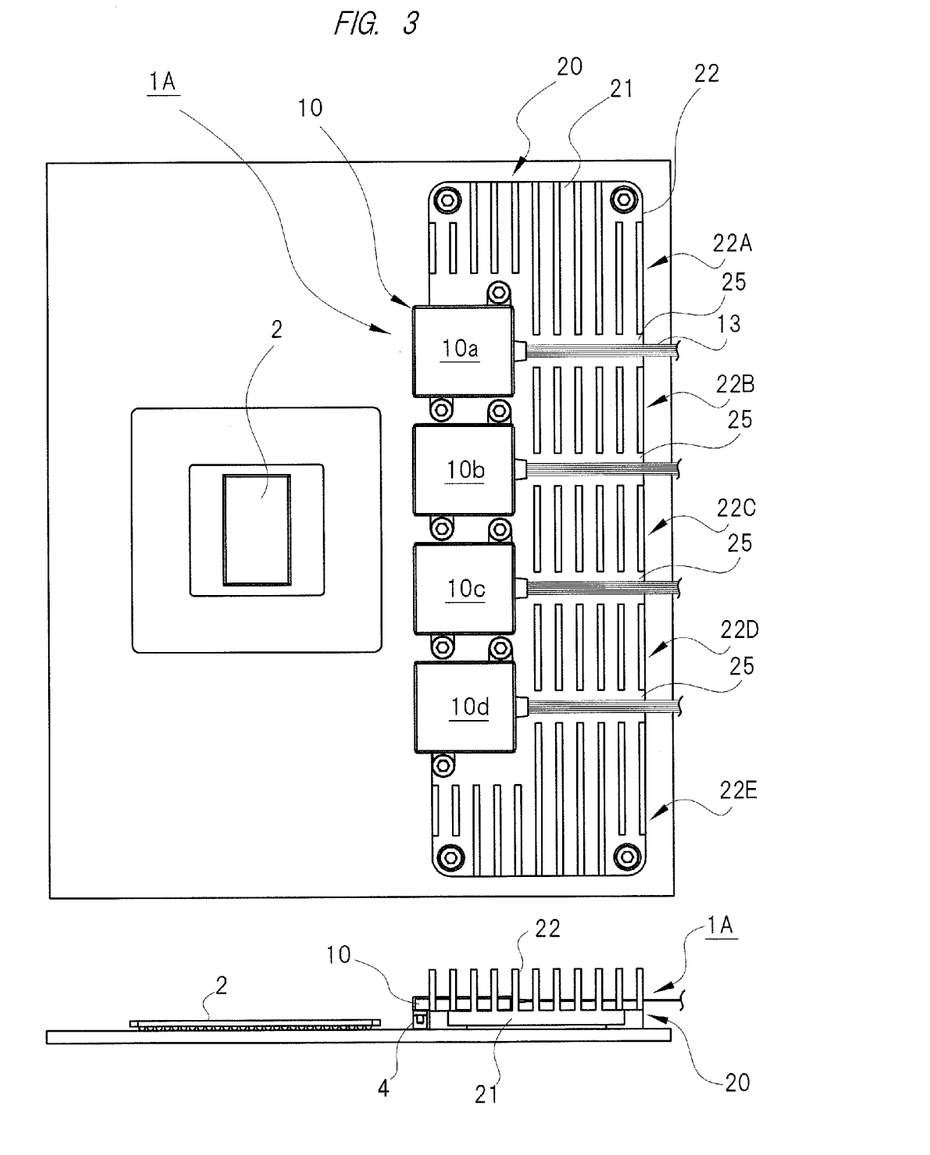
FIG. 3 is a plan view and a side view illustrating the signal transmission device according to the first embodiment.

Hereinafter, a first embodiment of the present invention is explained in detail with reference to the drawings. A signal transmission device 1A illustrated in FIGS. 1 to 3 is provided with: a plurality of communication modules 10 mounted on a substrate (motherboard) 3 on which an IC chip 2 is mounted; and a heat sink 20 configuring a cooling mechanism for cooling these communication modules 10. The heat sink 20 is provided with: a heat-transfer plate 21 whose planar shape is substantially rectangular; and a heat-release fin 22 integrally formed with a surface of the heat-transfer plate 21 as heat-release means.

In the present embodiment, the heat sink 20 is arranged in vicinity of one side of the IC chip 2 so that the one side is parallel to one side of the heat-transfer plate 21. Also, four communication modules 10 are aligned in one line along one side on the heat-transfer plate 21 of the heat sink 20 which is adjacent to the IC chip 2. One of two main surfaces of each of the communication modules 10 is arranged on the heat-transfer plate 21 in a direction of facing a surface of the plate-transfer plate 21. Accordingly, in the following explanation, a surface of the two main surfaces of the communication module 10 which faces the surface of the heat-transfer plate 21 is called a "bottom surface" or a "module bottom surface". Also, a surface of the two main surfaces of the communication module 10 which is on an opposite side of the bottom surface or the module bottom surface is called a "top surface" or a "module top surface".

Figure 4:
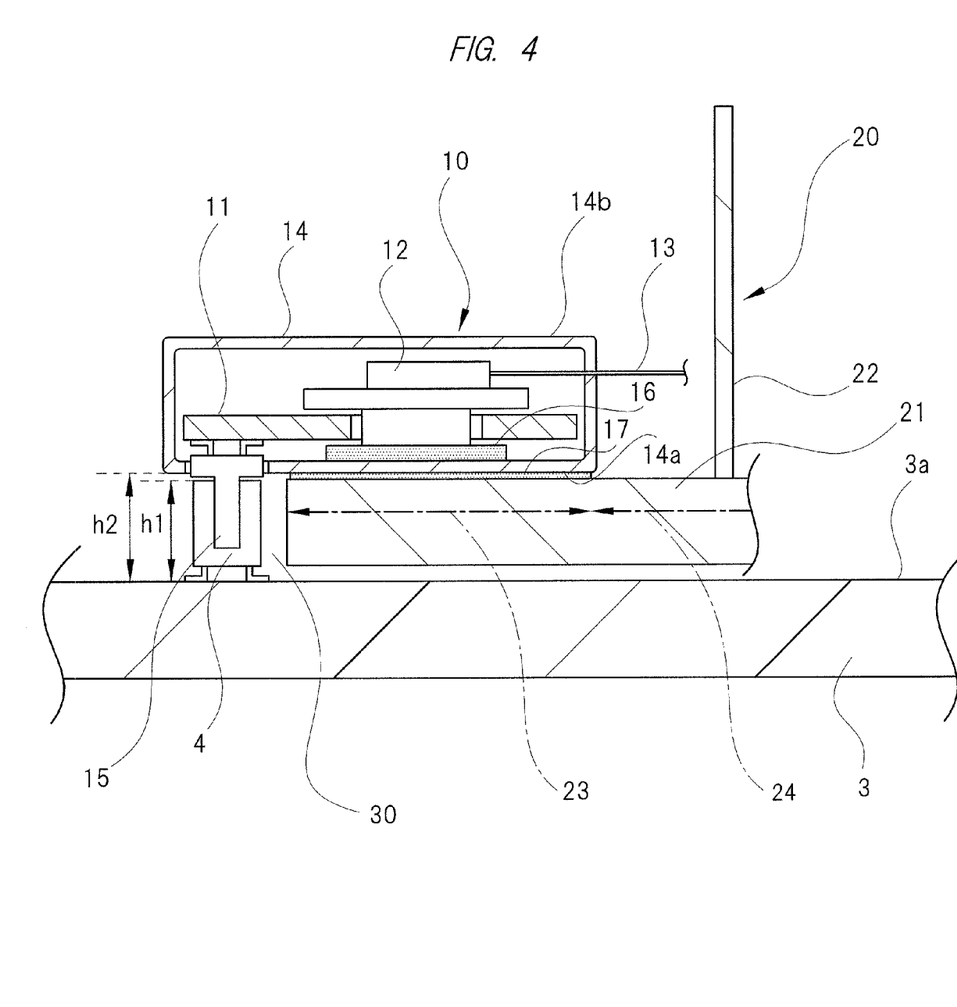
FIG. 4 is a partially-enlarged cross-sectional view of the signal transmission device according to the first embodiment.

As illustrated in FIG. 4, each of the communication modules 10 is provided with: a module substrate 11; an optical package 12 mounted on the module substrate 11; an optical fiber 13 extending from the optical package 12 as a communication cable; and a module case 14 having a substantially rectangular shape for housing them, and a bottom surface 14a of the communication module 10 is formed by a bottom plate of the module case 14 and a top surface 14b is formed by a ceiling plate thereof.

In the bottom surface 14a of the communication module 10, a plate-shaped first connector (module-side connector 15) is provided. The module-side connector 15 is linearly formed in vicinity of one side of the module bottom surface 14a so as to be along the one side, and has a surface with a connection terminal not illustrated which is provided thereon. The connection terminal of the module-side connector 15 is electrically connected to the optical package 12 through a printed wiring formed in the module substrate 11 which is not illustrated.

On the other hand, as illustrated in FIGS. 1 and 2, a plurality of second connectors (substrate-side connectors 4) to which the module-side connector 15 is connected are provided in a region which is on a mounting surface 3a of the substrate 3 and which is between the IC chip 2 and the heat sink 20. A trench 4a which is opened upward and to/from which the module-side connector 15 can be inserted/removed is linearly formed in a longitudinal direction, and a connection terminal which is not illustrated is provided on an inner surface of the trench 4a. The connection terminal of the substrate-side connector 4 is electrically connected to the IC chip 2 through a printed wiring not illustrated which is formed in the substrate 3.

The communication module 10 is mounted on the substrate 3 by inserting the module-side connector 15 into the trench 4a of the connector 4 from above the substrate-side connector 4. And, by inserting the module-side connector 15 into the trench 4a of the substrate-side connector 4, the connection terminals provided in the connectors 15 and 4 are in contact with and are electrically conducted to each other. In this manner, the IC chip 2 and the connection module 10 are electrically connected to each other, so that signals can be transmitted and received therebetween. Note that the communication module 10 (optical package 12) converts an electrical signal outputted from the IC chip 2 into an optical signal and inputs the signal to the optical fiber 13, and converts an optical signal outputted from the optical fiber 13 into an electrical signal and inputs the signal to the IC chip 2. That is, the communication module 10 converts a signal inputted/outputted to/from the IC chip 2 in E/O conversion and O/E conversion.

When such a mounting structure as described above is applied to the communication module 10, the communication module 10 is supported to be cantilevered from the substrate 3. Therefore, as illustrated in FIG. 4, a space 30 is generated between the mounting surface 3a of the substrate 3 and the module bottom surface 14a. More specifically, a space 30 higher than the substrate-side connector 4 is generated between the mounting surface 3a of the substrate 3 and the module bottom surface 14a. In FIG. 4, a height of the substrate-side connector 4 is represented as "h1", and a height of the space 30 is represented as "h2". That is, the space (dead space) 30 as high as or higher than the substrate-side connector 4 is generated between the substrate 3 and the communication module 10. In the present embodiment, this space (dead space) 30 is used for arranging the heat sink 20. Hereinafter, the arrangement is specifically explained.

As illustrated in FIGS. 1 to 3, the heat sink 20 is provided with: a plate-shaped heat-transfer plate 21; and a plurality of heat-release fins 22 formed in a predetermined region of the heat-transfer plate 21. The heat-transfer plate 21 and the heat-release fins 22 are integrally formed with each other by metal (for example, aluminum, copper, or others) having excellent heat conductivity.

Figure 5:
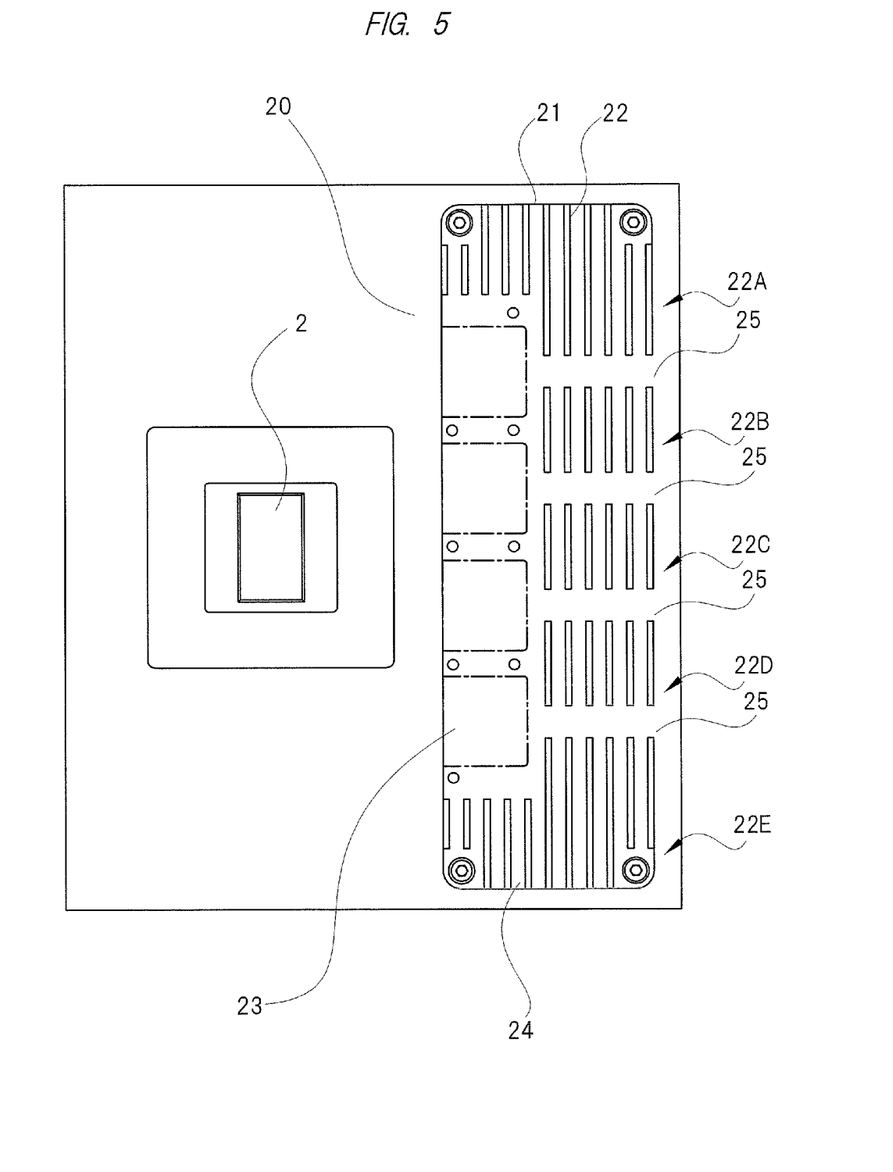
FIG. 5 is a plan view illustrating a first region and a second region on a heat-transfer plate.

As illustrated in FIGS. 1 and 2, a part of the heat-transfer plate 21 is arranged (inserted) between the substrate 3 and the communication module 10. In other words, the communication module 10 is placed on the heat-transfer plate 21 of the heat sink 20. As a result, as illustrated in FIG. 3, in the surface of the heat-transfer plate 21, there are a region thereof which overlaps with the bottom surface 14a (FIG. 4) of each of the communication modules 10 in plan view and a region thereof in periphery of the region which does not overlap with the bottom surface 14a (FIG. 4) of the communication module 10. In FIG. 5, the region (first region 23) thereof which overlaps with the bottom surface 14a (FIG. 4) of the communication module 10 is illustrated by a dashed line. As illustrated in FIG. 5, there are the first regions 23 as many as the communication modules 10 in the surface of the heat-transfer plate 21, and the region (second region 24) thereof which does not overlap with the bottom surface 14a (FIG. 4) of the communication module 10 expands in periphery of these first regions 23.

As illustrated in FIG. 4, the first region 23 on the heat-transfer plate 21 overlaps with the bottom surface 14a of the communication module 10 mounted thereon, and besides, is thermally connected to the bottom surface 14a. More specifically, the optical package 12 which is a main heat-generation source inside the communication module 10 and a bottom-plate inner surface of the module case 14 are in contact with each other through a heat conductive sheet 16. Also, a bottom-plate outer surface (module bottom surface 14a) of the module case 14 and the first region 23 of the heat-transfer plate 21 are in contact with each other through a heat conductive sheet 17. Therefore, heat generated from the optical package 12 transfers to the bottom plate of the module case 14 through the heat conductive sheet 16. The heat transferred to the bottom plate of the module case 14 transfers to the first region 23 of the heat-transfer plate 21 through the heat conductive sheet 17, and then, diffuses to the second region 24. In other words, the heat generated from the communication module 10 is guided downward (in a direction vertical to the substrate 3), and then, is guided in a lateral direction (a direction parallel to the substrate 3).

As illustrated in FIG. 5, in the second region 24 of the heat-transfer plate 21, a lot of heat-release fins 22 are provided as the heat-release means for releasing the heat which has been diffused to the second region 24 as described above toward air (atmosphere). The lot of heat-release fins 22 form five heat-release fin groups 22A to 22E each of which includes the plurality of heat-release fins 22 aligned in parallel to each other. Also, a space 25 is provided between the heat-release fin group 22A positioned on one end side of the heat-transfer plate 21 in a longitudinal direction and the heat-release fin group 22B adjacent thereto. Hereinafter, similarly, a space 25 is provided between the heat-release fin group 22E positioned on the other end side of the heat-transfer plate 21 in the longitudinal direction and the heat-release fin group 22D adjacent thereto. Further, spaces 25 are provided between the heat-release fin groups 22B/22D and the heat-release fin group 22C sandwiched by these heat-release fin groups 22B/22D, respectively.

As illustrated in FIG. 3, each of the communication modules 10 is arranged so as to be bridged between two heat-release fin groups in plan view. More specifically, a communication module 10a is bridged between the heat-release fin group 22A and the heat-release fin group 22B. A communication module 10b is bridged between the heat-release fin group 22B and the heat-release fin group 22C. A communication module 10c is bridged between the heat-release fin group 22C and the heat-release fin group 22D. A communication module 10d is bridged between the heat-release fin group 22D and the heat-release fin group 22E. That is, two heat-release fin groups are allocated to one communication module 10.

Further, an optical fiber 13 pulled from the communication module 10a is pulled outside through the space 25 between the heat-release fin group 22A and the heat-release fin group 22B. Hereinafter, similarly, an optical fiber 13 pulled from the communication module 10b is pulled outside through the space 25 between the heat-release fin group 223 and the heat-release fin group 22C, an optical fiber 13 pulled from the communication module 10c is pulled outside through the space 25 between the heat-release fin group 22C and the heat-release fin group 22D, and an optical fiber 13 pulled from the communication module 10d is pulled outside through the space 25 between the heat-release fin group 22D and the heat-release fin group 22E. Note that each space 25 forms a space for pulling the optical fiber 13 onto the heat sink 20, and besides, plays a role of generating turbulence flow between the adjacent heat-release fin groups so as to increase a cooling effect.

As described above, in a signal transmission device 1A according to the present embodiment, the plurality of communication modules 10 are arranged on one heat sink 20. That is, the signal transmission device 1A according to the present embodiment is the collective-type signal transmission device. Therefore, such a merit of the collective type that the plurality of communication modules 10 can be densely arranged in the periphery of the IC chip 2 is not lost at all.

Further, in the signal transmission device 1A according to the present embodiment, most of the heat generated from the communication module 10 is not released in an upper portion of the communication module 10 toward air but is guided to a lower portion of the module 10, and then, guided in the lateral direction. Therefore, the heat generated from the communication module 10 can be released from the surface of the heat-release fin 22 provided in the periphery of the module 10 toward the air. In other words, in the upper portion of the module, it is not required to provide the heat-release fin for releasing the heat generated from the communication module 10 toward the air. Therefore, the height of the signal transmission device 1A according to the present embodiment can be suppressed lower than that of the collective-type signal transmission device in which the heat-release fin is provided in the upper portion of the communication module.

In addition, the heat-transfer plate 21 for guiding the heat generated from the communication module 10 toward the heat-release fin 22 provided in the periphery of the communication module 10 is arranged in the space 30 between the substrate 3 and the communication module 10. That is, the dead space between the substrate 3 and the communication module 10 is effectively used, so that the height of the signal transmission device 1A can be suppressed further lower.

Also, since the communication module 10 is not covered with the heat-transfer plate 21, maintenance for the communication module 10 can be simplified. For example, in a mode in which the plurality of communication modules are collectively covered with the heat-transfer plate, it is required to detach the heat-transfer plate (heat sink) if failure occurs in even one of these communication modules. On the other hand, in the signal transmission device 1A according to the present embodiment, only the communication module 10 in which the failure occurs can be replaced or checked without detaching the heat sink 20. Further, while the most of the heat generated from the communication module 10 is guided to the heat-release fin 22 provided in the periphery of the communication module 10 through the heat-transfer plate 21, a part of the heat generated from the communication module 10 can be released also from the top surface 14b of the communication module 10 in the signal transmission device 1A according to the present embodiment in which the upper portion of the communication module 10 is opened. That is, in the signal transmission device 1A according to the present embodiment, the heat is released from both of the top surface 14b and the bottom surface 14a of the communication module 10, so that the communication module 10 is further effectively cooled.

Also, the heat-transfer plate 21 arranged in the space 30 between the substrate 3 and the communication module 10 plays a role of supporting the communication module 10 from the lower portion thereof. As a matter of fact, if the communication module 10 is sufficiently supported without the support by the heat-transfer plate 21, it is not required to support the communication module 10 by the heat-transfer plate 21.

Second Embodiment

Hereinafter, a second embodiment of the present invention is explained in detail with reference to FIG. 6. As a matter of fact, a signal transmission device 1B illustrated in FIG. 6 has basically the same configuration as that of the signal transmission device 1A according to the first embodiment. A different point between the signal transmission device 1B according to the present embodiment and the signal transmission device 1A according to the first embodiment is that the cooling mechanism in the signal transmission device 1B is a liquid cooling type while the cooling mechanism in the signal transmission device 1A is an air cooling type. Accordingly, common configurations with the signal transmission device 1A are represented by using the same reference symbols for the explanation, and repetitive explanation thereof is appropriately omitted. Also, the following explanation is made with reference to FIGS. 1 to 5 if needed.

Figure 6:
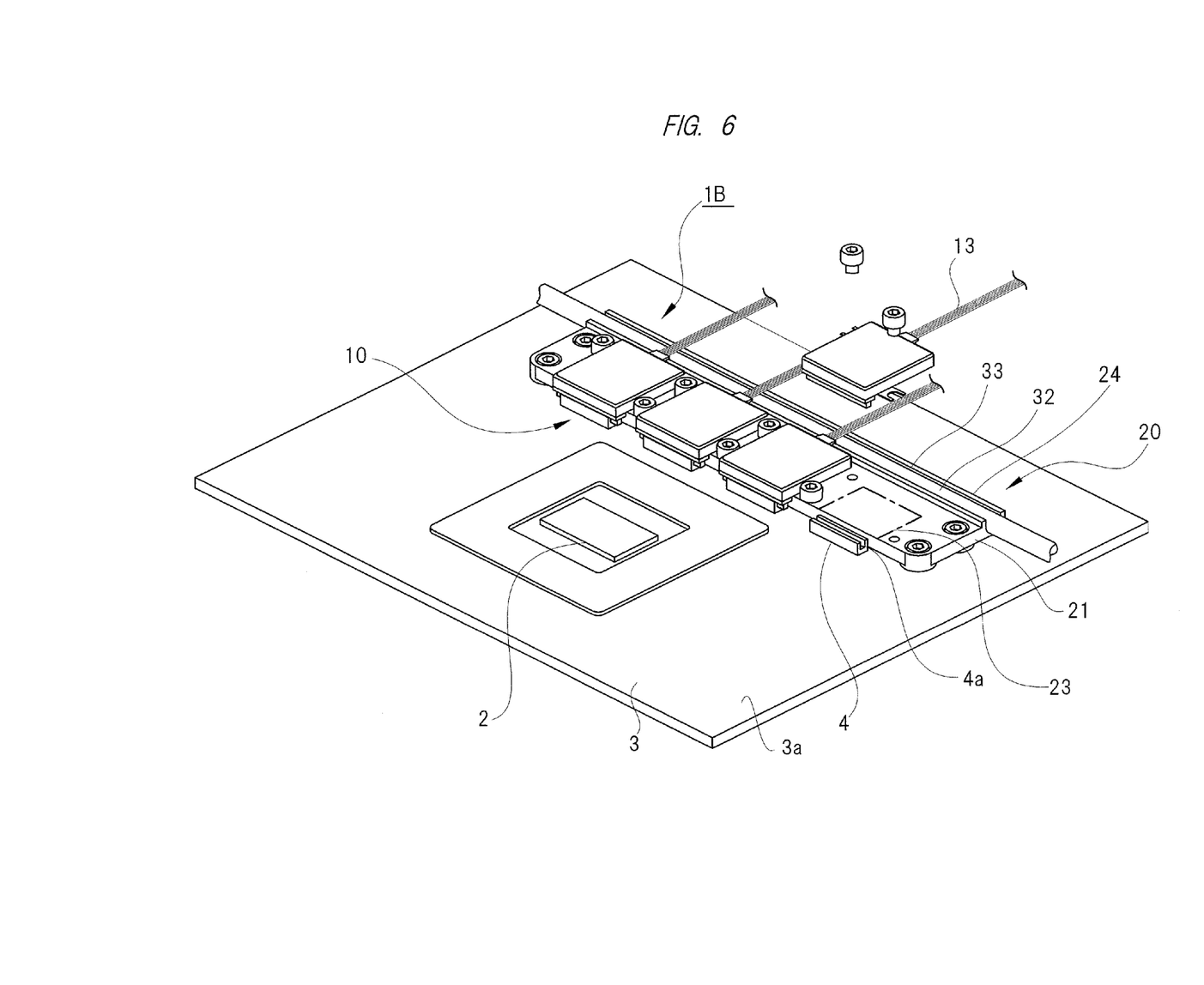
FIG. 6 is a front perspective view illustrating a signal transmission device according to a second embodiment.

The heat sink 20 provided in the signal transmission device 1B illustrated in FIG. 6 is provided with a heat-transfer plate 21 whose planar shape is substantially rectangular and a water-cooling pipe 32 for forming a refrigerant passage on the heat-transfer plate 21.

A mounting structure of the communication module 10 in the signal transmission device 1B according to the present embodiment is the same as that in the signal transmission device 1A according to the first embodiment. That is, the communication module 10 illustrated in FIG. 6 is supported to be cantilevered from the substrate 3 by connecting the module-side connector 15 to the substrate-side connector 4. Therefore, there is the same space as the space 30 illustrated in FIG. 4 between the substrate 3 and the communication module 10, and a part of the heat-transfer plate 21 is arranged in (inserted into) this space. Therefore, as illustrated in FIG. 6, in the surface of the heat-transfer plate 21, there are the first region 23 which overlaps with the bottom surface 14a (FIG. 4) of the communication module 10 in the plan view and the second region 24 which does not overlap with the bottom surface 14a of the communication module 10 therein. Note that FIG. 6 illustrates only one first region 23. However, in practice, also in the surface of the heat-transfer plate 21 illustrated in FIG. 6, there are the first regions 23 whose shape and number are the same as those of the first regions 23 illustrated in FIG. 5.

The water-cooling pipe 32 is arranged in the second region 24 of the heat-transfer plate 21 so as to cross the heat-transfer plate 21. More specifically, a holding trench 33 is integrally formed with the second region 24 of the heat-transfer plate 21 in the longitudinal direction of the heat-transfer plate 21, and the water-cooling pipe 32 is fitted inside the holding trench 33 so as to be held.

FIG. 6 illustrates only a part of the water-cooling pipe 32 (which is the part crossing the heat-transfer plate 21), and illustration of the other part thereof is omitted. In practice, at least a pump and a heat exchanger are provided in the not-illustrated part of the water-cooling pipe 32, and cooling water serving as refrigerant is circulated by operation of the pump not illustrated.

Also in the signal transmission device 1B according to the present embodiment, the communication module 10 and the heat-transfer plate 21 are thermally connected to each other by the same structure as the structure illustrated in FIG. 4. Therefore, the heat generated from the optical package 12 is transferred to the first region 23 of the heat-transfer plate 21 through the heat conductive sheet 16, the module case 14, and the heat conductive sheet 17, and then, is diffused to the second region 24 thereof. The heat diffused to the second region 24 is collected by the heat exchange to/from the cooling water circulated inside the water-cooling pipe 32. The cooling water which has collected the heat releases the heat in the heat exchanger not illustrated, and then, circulates inside the water-cooling pipe 32 again.

As described above, the signal transmission device 1B according to the present embodiment and the signal transmission device 1A according to the first embodiment have the common configuration except for a method of the cooling mechanism. Therefore, the signal transmission device 1B according to the present embodiment has the same effect as that of the signal transmission device 1A according to the first embodiment. Further, the cooling mechanism of the liquid cooling type has generally a higher cooling performance than that of the cooling mechanism of the air cooling type. Also, it is advantageous that temperature control of the cooling mechanism of the liquid cooling type or others is easier and more accurate than that of the cooling mechanism of the air cooling type.

Figure 7:
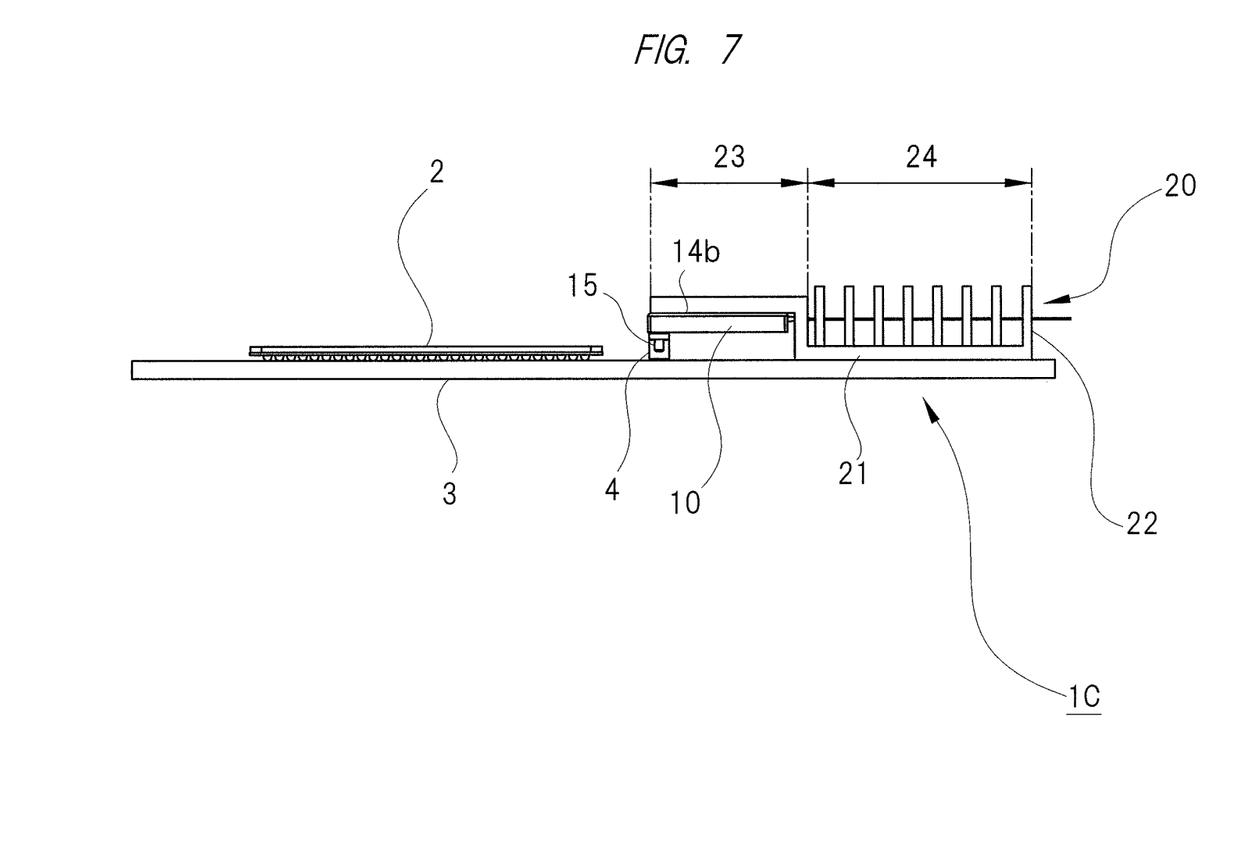
FIG. 7 is a side view illustrating a signal transmission device according to another embodiment.

The present invention is not limited to the foregoing embodiments and various modifications and alterations can be made within the scope of the present invention. For example, in the first embodiment and the second embodiment, the heat-transfer plate 21 of the heat sink 20 is arranged in the space 30 between the substrate 3 and the communication module 10 (FIG. 4). However, as illustrated in FIG. 7, an embodiment in which the heat-transfer plate 21 of the heat sink 20 is arranged on the communication module 10 is also cited. In this embodiment, in a rear surface of the heat-transfer plate 21, a first region 23 which overlaps with the top surface 14b of the communication module 10 and is thermally connected to the top surface 14b is formed. Also, the heat-transfer plate 21 is bent in a crank shape in side view, the second region 24 which does not overlap with the top surface 14b of the communication module 10 is formed at a position lower than the first region 23, and the heat-release fin 22 is provided in the second region 24. Therefore, a height of a signal transmission device 1C illustrated in FIG. 7 is lower than that in the case in which the heat-release fin 22 is provided on the communication module 10.

In the embodiment in which the heat-transfer plate 21 of the heat sink 20 is arranged on the communication module 10, note that the arrangement of the heat conductive sheets 16 and 17 illustrated in FIG. 4 is appropriately changed. More specifically, the heat conductive sheet 16 illustrated in FIG. 4 is arranged between the optical package 12 and the inner surface of the ceiling plate of the module case 14 illustrated in the same drawing. Also, the heat conductive sheet 17 illustrated in FIG. 4 is arranged between the outer surface (module top surface 14b) of the ceiling plate of the module case 14 illustrated in the same drawing and the first region 23 of the heat-transfer plate 21 illustrated in FIG. 7. In this manner, the heat generated from the optical package 12 transfers to the ceiling plate of the module case 14 through the heat conductive sheet 16. Then, the heat transferred to the ceiling plate of the module case 14 transfers to the first region 23 of the heat-transfer plate 21 through the heat conductive sheet 17, and diffuses to the second region 24. That is, most of the heat generated from the communication module 10 is not released directly toward the upper portion but is guided in the lateral direction (the direction parallel to the substrate 3) through the heat-transfer plate 21, and then, is released from the surface of the heat-release fin 22. In this point, the embodiment illustrated in FIG. 7 is not different from the first embodiment and the second embodiment.

In the embodiment explained up to here, the module-side connector 15 is linearly formed along one side of the module bottom surface 14a, and the substrate-side connector 4 to which the module-side connector 15 is inserted is also linearly formed. Therefore, as illustrated in FIG. 4, when the module-side connector is inserted into the substrate-side connector 4, the communication module 10 and the substrate-side connector 4 have appearance of a substantially L shape in the side view. Therefore, as illustrated in FIG. 5, even if one side of the heat-transfer plate 21 arranged in the space 30 (FIG. 4) between the substrate 3 and the communication module 10 is linear, the one side can be inserted into the space 30 between the substrate 3 and the communication module 10. On the other hand, if the module-side connector 15 and the substrate-side connector 4 are non-linearly formed, one side of the heat-transfer plate 21 inserted into the space 30 between the substrate 3 and the communication module 10 is formed in a non-linear shape (for example, sinking-comb shape) in order to avoid interference with these connectors 15 and 4. That is, the embodiment explained up to here have also an advantage that it is not required to form the heat-transfer plate 21 in a complicated shape. As a matter of fact, a mode in which the one side of the heat-transfer plate 21 is non-linearly formed along with the non-linear formation of the module-side connector 15 and the substrate-side connector 4 is not excluded from a technical scope of the present invention.

The heat conductive sheets 16 and 17 illustrated in FIG. 4 can be replaced with grease having the excellent heat conductivity or others. As a matter of fact, if the sufficient heat conductivity can be obtained without the heat conductive sheet and the grease, the heat conductive sheet, the grease, and others can be eliminated.

The arrangement, the number, the shape, and others of each of the communication module 10, the heat-release fin 22, the water-cooling pipe 32, and others illustrated in the attached drawings are merely one example thereof, and they can be appropriately changed if needed. For example, the heat-transfer plate 21 of the heat sink 20 can be arranged so as to surround four sides of the IC chip 2 illustrated in FIG. 1 or others, and the plurality of communication modules 10 can be arranged on the heat-transfer plate 21 so as to surround four sides of the IC chip 2. Obviously, the communication module 10 can be also arranged so as to be along two sides or three sides of the IC chip 2. In any case, in the signal transmission device of the present invention in which the common heat-transfer plate is provided with respect to the plurality of communication modules, it is not required to avoid the interference between the heat-transfer plates adjacent to each other, and therefore, the plurality of communication modules can be densely arranged in the periphery of the IC chip, and the signal transmission distance between each of the plurality of communication modules and the IC chip can be decreased as short as possible.

What is claimed is:

1. A signal transmission device provided with a communication module provided on a substrate, and a cooling mechanism for cooling the communication module, the cooling mechanism comprising:

a heat-transfer plate including a first region which overlaps with main surfaces of a plurality of the communication modules and is thermally connected to the main surfaces and a second region which does not overlap with the main surfaces of the plurality of the communication modules; and a plurality of heat-release fins arranged on the second region of the heat-transfer plate, wherein two or more heat-release fin groups each of which includes the plurality of heat-release fins are arranged adjacent to each other through a space, the communication module is arranged on an extension line of the space, and a communication cable extending from the communication module is pulled outside through the space.

2. The signal transmission device according to claim 1, wherein the communication module is supported to be cantilevered from the substrate by connecting a first connector provided along one side of the communication module to a second connector provided in the mounting surface of the substrate.

* * * * *